(12) United States Patent
Jeong et al.

(10) Patent No.: US 7,015,590 B2
(45) Date of Patent: Mar. 21, 2006

(54) REINFORCED SOLDER BUMP STRUCTURE AND METHOD FOR FORMING A REINFORCED SOLDER BUMP

(75) Inventors: Se-young Jeong, Suwon (KR); Nam-seog Kim, Yongin (KR); Oh-se Yong, Yongin (KR); Soon-bum Kim, Suwon (KR); Sun-young Park, Iksan (KR); Ju-hyun Lyu, Cheonan (KR); In-young Lee, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/825,199

(22) Filed: Apr. 16, 2004

(65) Prior Publication Data

US 2004/0197979 A1 Oct. 7, 2004

Related U.S. Application Data

(63) Continuation-in-part of application No. 10/339,456, filed on Jan. 10, 2003.

(30) Foreign Application Priority Data

Sep. 23, 2003 (KR) ....................... 10-2003-0065946

(51) Int. Cl.
*H01L 21/461* (2006.01)
*H01L 21/469* (2006.01)

(52) U.S. Cl. ...................... 257/780; 257/738; 438/613

(58) Field of Classification Search ................ 228/165, 228/180.2, 254, 248.1; 361/768–770; 438/613–617, 438/123; 257/737–740, 780
See application file for complete search history.

(56) References Cited

U.S. PATENT DOCUMENTS 5,431,328 A 7/1995 Chang et al.

(Continued)

FOREIGN PATENT DOCUMENTS

JP 08-090285 4/1996

(Continued)

OTHER PUBLICATIONS

Korean Office Action Jul. 11, 2005 for Korean Application No. 2003-0065946.

*Primary Examiner*—David Nelms
*Assistant Examiner*—Calvin Lee
(74) *Attorney, Agent, or Firm*—Harness, Dickey & Pierce, P.L.C.

(57) ABSTRACT

A reinforced solder bump connector structure is formed between a contact pad arranged on a semiconductor chip and a ball pad arranged on a mounting substrate. The semiconductor chip includes at least one reinforcing protrusion extending upwardly from a surface of an intermediate layer. The mounting substrate includes at least one reinforcing protrusion extending upwardly from a ball pad, the protrusions from both the chip and the substrate being embedded within the solder bump connector. In some configurations, the reinforcing protrusion from the contact pad and the ball pad are sized and arranged to have overlapping under portions. These overlapping portions may assume a wide variety of configurations that allow the protrusions to overlap without contacting each other including pin arrays and combinations of surrounding and surrounded elements. In each configuration, the reinforcing protrusions will tend to suppress crack formation and/or crack propagation thereby improving reliability.

18 Claims, 14 Drawing Sheets

U.S. PATENT DOCUMENTS

| | | | |
|---|---|---|---|
| 5,674,326 A | 10/1997 | Wrezel et al. | |
| 5,837,119 A | 11/1998 | Kang et al. | |
| 5,906,312 A | 5/1999 | Zakel et al. | |
| 5,914,536 A | 6/1999 | Shizuki et al. | |
| 5,958,590 A | 9/1999 | Kang et al. | |
| 6,028,357 A | 2/2000 | Moriyama | |
| 6,088,236 A | 7/2000 | Tomura et al. | |
| 6,297,562 B1 | 10/2001 | Tilly | |
| 6,465,879 B1 | 10/2002 | Taguchi | |
| 6,841,872 B1 * | 1/2005 | Ha et al. | 257/736 |
| 2001/0045668 A1 | 11/2001 | Liou et al. | |
| 2001/0054771 A1 | 12/2001 | Wark et al. | |
| 2002/0053467 A1 | 5/2002 | Gebauer et al. | |
| 2003/0167632 A1 * | 9/2003 | Thomas et al. | 29/841 |

FOREIGN PATENT DOCUMENTS

| | | | |
|---|---|---|---|
| JP | 11-297873 | | 10/1999 |
| JP | 11-345826 | | 12/1999 |
| JP | 2000-091371 | | 3/2000 |
| JP | 2000-241499 | | 9/2000 |
| JP | 2001-284387 | | 10/2001 |
| JP | 2002-228707 | | 8/2002 |
| KR | 1998-0060735 | | 8/1999 |
| KR | 2000-0058035 | | 9/2000 |
| KR | 2001-0068233 | | 7/2001 |
| KR | 2001-0068378 | * | 7/2001 |
| KR | 2001-0098699 | | 11/2001 |
| KR | 2001-0105270 | | 11/2001 |

* cited by examiner

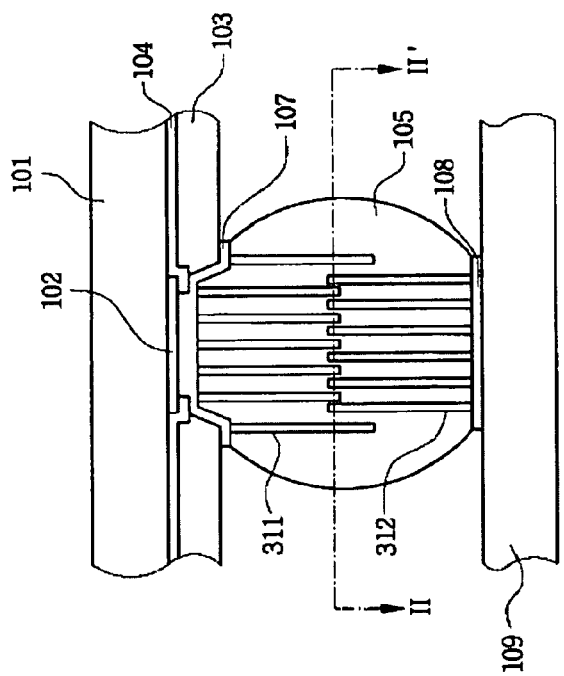
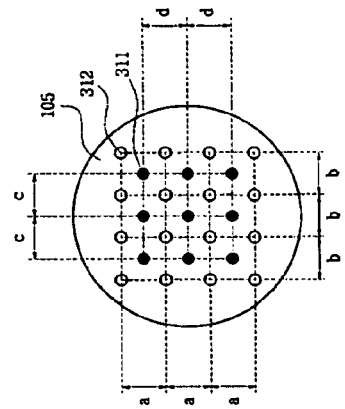
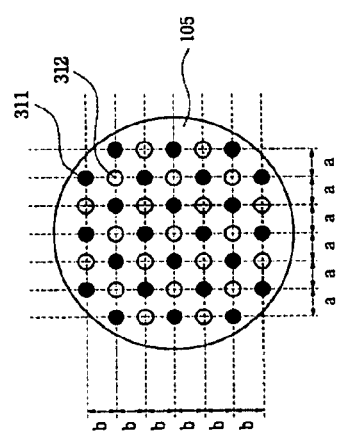
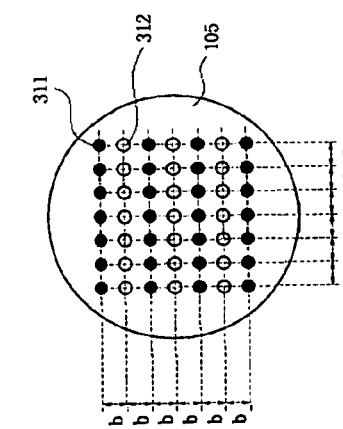
FIG. 6A
FIG. 6B
FIG. 6C
FIG. 6D

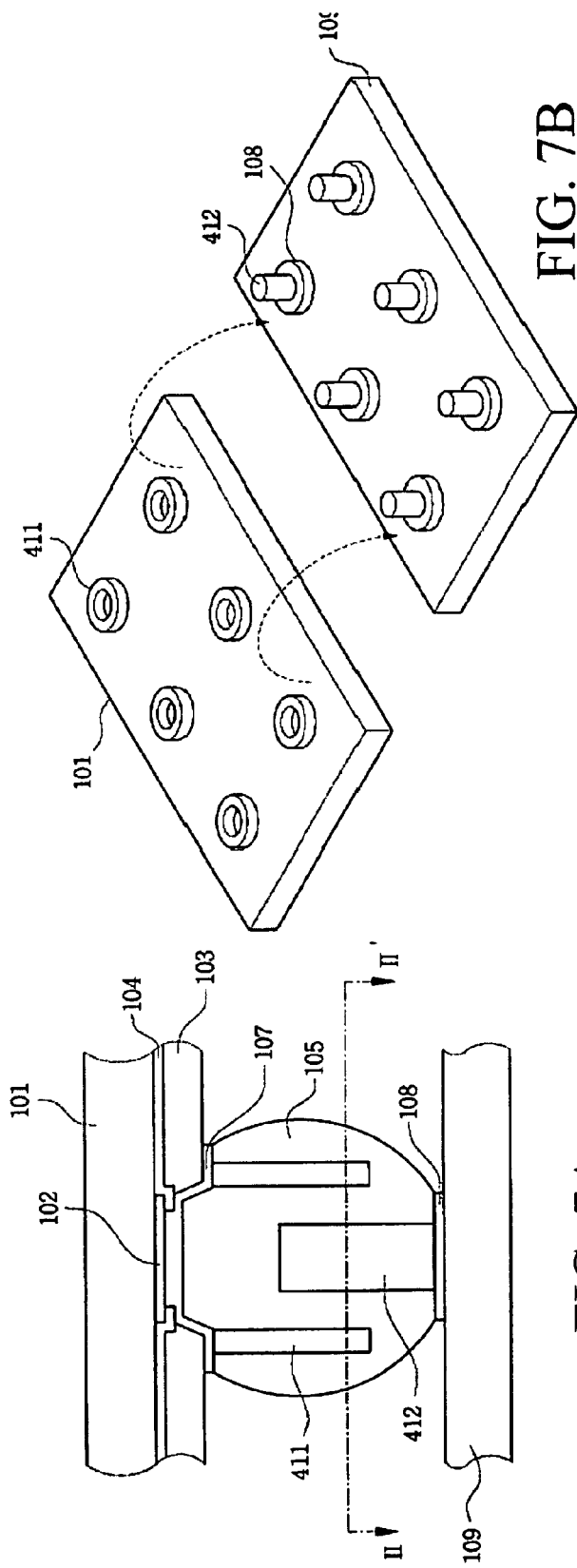
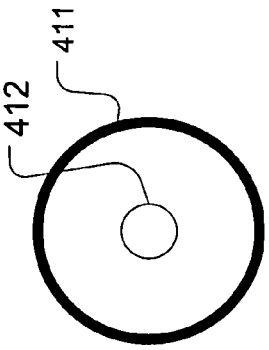
FIG. 7B
FIG. 7C
FIG. 7A

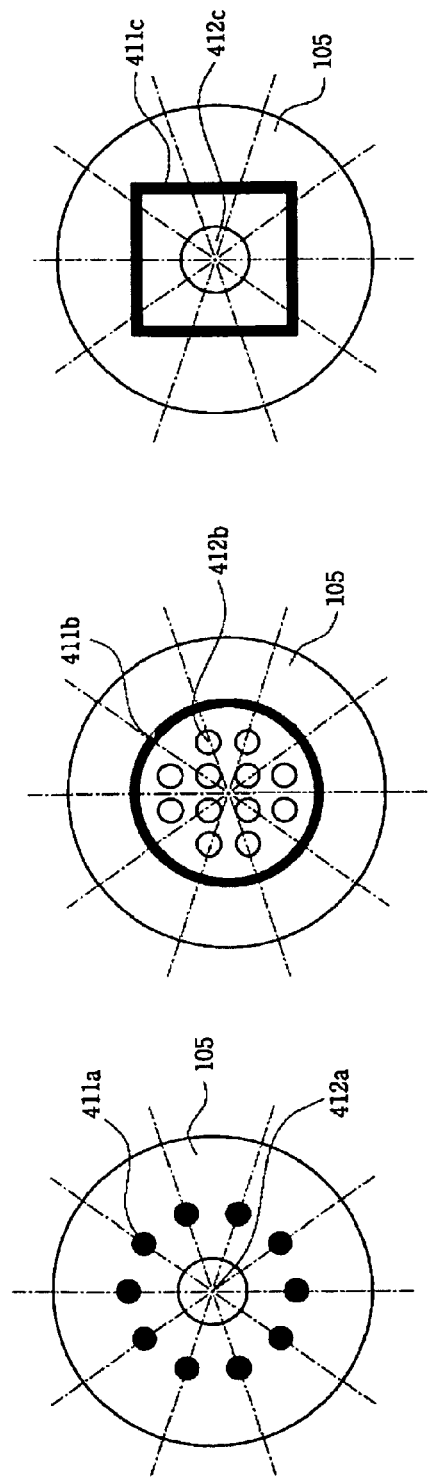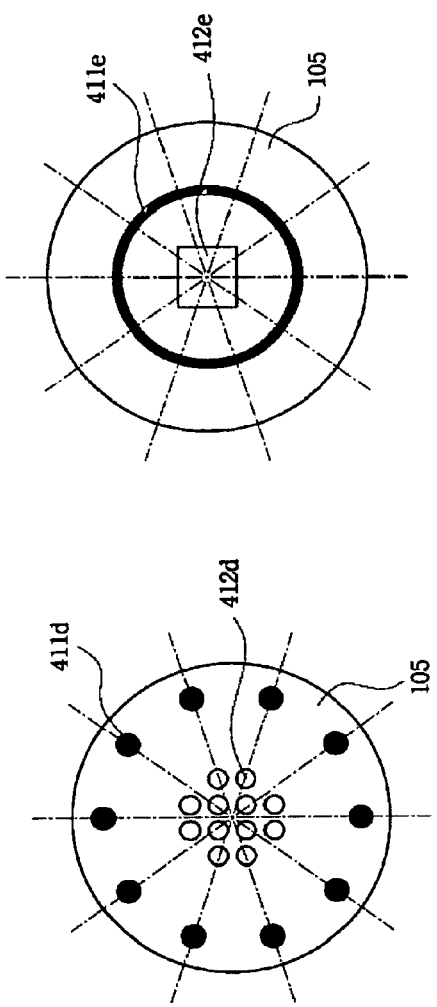

REINFORCED SOLDER BUMP STRUCTURE AND METHOD FOR FORMING A REINFORCED SOLDER BUMP

CROSS-REFERENCE TO RELATED APPLICATIONS

This application is a continuation-in-part of U.S. patent application Ser. No. 10/339,456, filed Jan. 10, 2003, and claims priority from Korean Application No. 2003-65946, filed Sep. 23, 2003, the contents of which are incorporated herein by reference in their entirety.

BACKGROUND OF THE INVENTION

1. Field of the Invention

The present invention generally relates to solder connections useful for integrated circuit (IC) chips and devices and, more particularly, to reinforced solder bump structures that reduce mechanical failures of IC chips and devices, and to exemplary methods for forming such solder bump structures.

2. Description of the Related Art

As integrated circuits (IC's) advance toward higher speeds and larger pin counts, first-level interconnection techniques employing wire bonding technologies have approached or even reached their limits. New improved technologies for achieving fine-pitch wire bonding structures cannot keep pace with the demand resulting from increased IC chip processing speeds and higher IC chip pin counts. As such, the current trend is to replace wire bonding structures with other package structures, such as a flip chip packages and a wafer level packages (WLP).

Flip chip packages and WLP structures are partially characterized by the provision of solder bumps which connect to interconnection terminals of the IC chip. (Herein, unless otherwise specified, the term solder "bumps" is intended to encompass solder "balls" as well.) Device reliability is thus largely dependent on the structure and material of each solder bump and its effectiveness as an electrical interconnect.

A conventional solder bump structure will be described with reference to FIGS. 1 and 2, where like elements are designated by the same reference numbers. FIG. 1 shows the state of a flip chip package prior to mounting on a printed circuit board (PCB) substrate, and FIG. 2 shows the flip chip package mounted on the PCB substrate.

In FIGS. 1 and 2, an integrated circuit (IC) chip 1 is equipped with a chip pad 2, which is typically formed of aluminum. An opening is defined in one or more passivation layers 3 and 4 which expose a surface of the chip pad 2. Interposed between a solder bump 5 and the chip pad 2 are one or more under bump metallurgy (UBM) layers 6 and 7.

The UBM layers 6 and 7 functions to secure the bump 5 reliably to the chip pad 2 and to prevent moisture absorption into chip pad 2 and IC chip 1. Typically, the first UBM layer 6 functions as an adhesion layer and is deposited by sputtering a layer of Cr, Ti, or TiW. Also typically, the second UBM layer 7 functions as a wetting layer and is deposited by sputtering a layer of Cu, Ni, or NiV onto the adhesion layer. Optionally, a third oxidation suppression layer of Au (not shown) may be deposited as well. Referring to FIG. 2, the solder bump 5 is mounted to a PCB pad 8 of a PCB substrate 9.

Mechanical stresses on the solder bump are a source of structural defects and related failures which can substantially impair device reliability. That is, when the chip heats up during use, both the chip and the PCB expand in size. Conversely, when the chip cools during an idle state, both the chip and the PCB substrate contract in size. The chip and the PCB substrate, however, have mismatched coefficients of thermal expansion, and therefore expand and contract at different rates, thus placing mechanical stress on the intervening solder bumps. FIG. 3 illustrates an example in which mechanical stresses have caused a substantially horizontal crack to form and begin propagating through the solder bump. In this figure, reference number 2 denotes a chip pad, reference number 5 denotes the solder bump, reference number 8 denotes the PCB pad, and reference number 10 denotes a crack or fissure. The larger the crack, the more the interconnection becomes degraded or impaired, and device failures, particularly soft failures, can begin arising even before the cracks propagate completely through the solder bump structure.

SUMMARY OF THE INVENTION

Exemplary embodiments of the invention provide methods for manufacturing improved solder bump connectors in which a reinforcing protrusion projects into and is embedded in the solder bump from both the contact pads provided on the semiconductor chip and the ball pads provided on the mounting substrate. These reinforcing protrusions are typically produced by forming a photoresist pattern and then filling the openings in the pattern with one or more reinforcing materials and then removing the photoresist. A second photoresist pattern may then be applied to form a second opening exposing the protrusions and an adjacent portion of the associated contact pad and then filling the opening with a solder composition. This second photoresist pattern may then be removed to leave the protrusions extending from the contact pads embedded in a solder material. This solder material may then be reflowed to produce the initial solder bump and again to embed the protrusion(s) formed on the ball pad and complete the solder connection between the semiconductor device and the mounting substrate.

According to another exemplary embodiment of the present invention, methods for manufacturing a solder bump may include depositing an intermediate layer over a contact pad, forming a photoresist layer over a surface of the intermediate layer, patterning the photoresist to define at least one opening which partially exposes the surface of the intermediate layer, filling the opening(s) of the photoresist pattern with one or more conductive materials, preferably one or more metals, and removing the photoresist to expose one or more protrusions formed from the conductive material(s) extending upwardly from the surface of the intermediate layer and then embedding the protrusion(s) in a solder material formed over the intermediate layer.

According to another exemplary embodiment of the present invention, methods for manufacturing a solder bump may include forming a ball pad on the mounting substrate, forming a photoresist over a surface of the ball pad, patterning the photoresist to define at least one opening which partially exposes the surface of the ball pad, filling the opening(s) of the photoresist pattern with one or more conductive materials, preferably one or more metals, and removing the photoresist to expose one or more protrusions formed from the conductive material(s) extending upwardly from the surface of the ball pad, placing the protrusion(s) from the ball pad in close proximity to the solder material and protrusion(s) on a corresponding contact pad and then reflowing the solder material to form a solder connection between the semiconductor device and the mounting substrate.

According to another exemplary embodiment of the present invention, methods for manufacturing solder bumps may include depositing an intermediate layer over a contact pad, forming a photoresist layer over a surface of the intermediate layer, patterning the photoresist to define a photoresist pattern having at least one opening which partially exposes the surface of the intermediate layer, filling the opening(s) with a metal to a first depth, filling a remaining portion of the opening(s) with a solder material to a second depth to form an intermediate structure wherein the solder material is stacked on the metal within each opening, removing the photoresist and reflowing the solder material to form a solder bump having the reinforcing protrusion(s) embedded therein.

According to another exemplary embodiment of the present invention, a method for manufacturing a solder bump is provided wherein the reinforcing protrusions from the contact pad and the ball pad are arranged in complementary configurations that allow upper portions of both protrusions to overlap within the solder bump. The overlapping portions may be arranged in a variety of configurations and may be symmetrical about one or more axes that may be substantially normal or parallel to the surfaces of the contact pads and ball pads.

According to another exemplary embodiment of the present invention, a solder bump structure is provided, which includes a contact pad, an intermediate layer located over the contact pad, a solder bump located over the intermediate layer, and at least one reinforcing protrusion extending upwardly from a surface of the intermediate layer and embedded within the solder bump. According to another exemplary embodiment of the present invention, semiconductor packages including such reinforced solder bump connectors are provided.

BRIEF DESCRIPTION OF THE DRAWINGS

The structure and advantages of the present invention will become readily apparent from the detailed description that follows, with reference to the accompanying drawings, in which:

FIGS. 6A–6D illustrate a solder bump structure according to another exemplary embodiment of the present invention;

FIGS. 7A–7C illustrate a solder bump structure according to yet another exemplary embodiment of the present invention;

FIGS. 8A–8E illustrate a solder bump structure according to another exemplary embodiment of the present invention;

Figure 1:
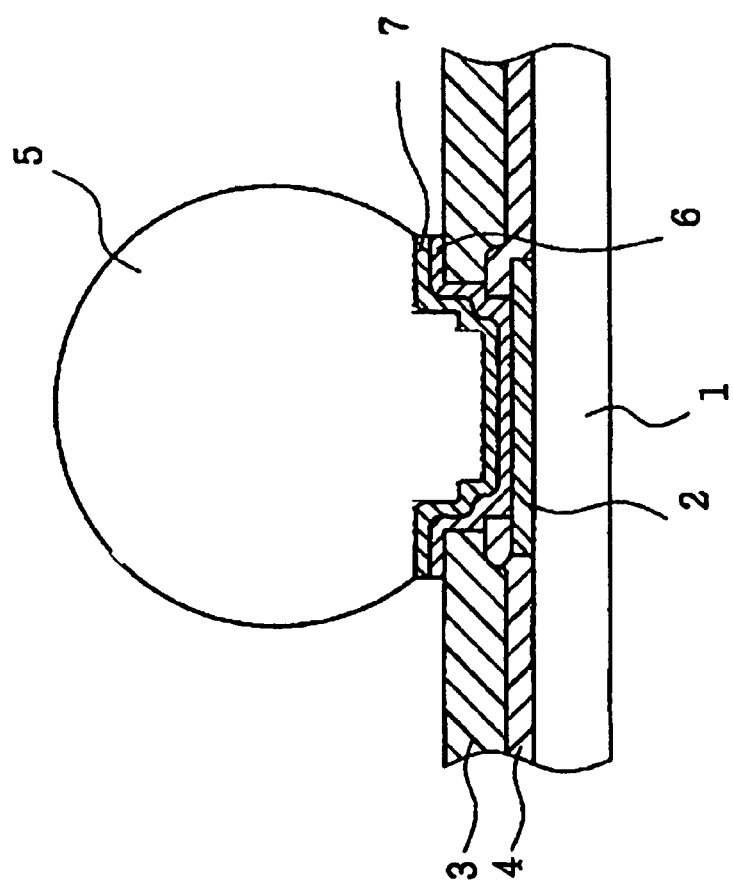
FIG. 1 illustrates a conventional flip-chip structure prior to mounting on a printed circuit board substrate.
Figure 2:
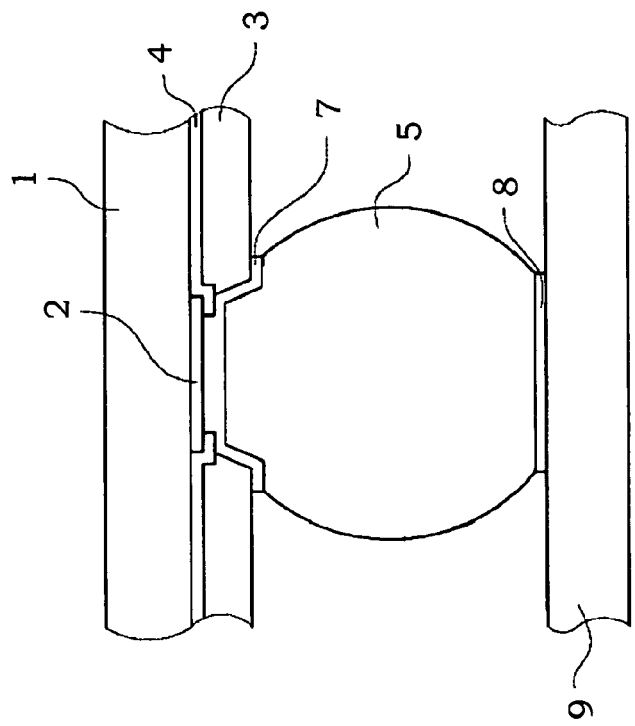
FIG. 2 illustrates a conventional flip-chip structure after mounting on a printed circuit board substrate.

These drawings have been provided to assist in the understanding of the exemplary embodiments of the invention as described in more detail below and should not be construed as unduly limiting the invention. In particular, the relative spacing, sizing and dimensions of the various elements illustrated in the drawing are not drawn to scale and may have been exaggerated, reduced or otherwise modified for the purpose of improved clarity. Those of ordinary skill in the art will also appreciate that certain layers that may be commonly utilized in the manufacture of semiconductor devices including, for example, photoresist patterns and multilayer metallization structures, have been omitted simply to improve clarity and reduce the number of drawings.

DETAILED DESCRIPTION OF EXEMPLARY EMBODIMENTS

The present invention is at least partially characterized by the inclusion of one or more reinforcing protrusions within the solder bump material to suppress the formation and/or propagation of cracks within the solder bump material during the operation of the final device, due at least in part to thermal cycling and mechanical stresses induced by mismatched coefficients of expansion between the various components. While the reinforcing protrusions can take any number of forms, the invention will be described below with reference to several exemplary embodiments.

Figure 4B:
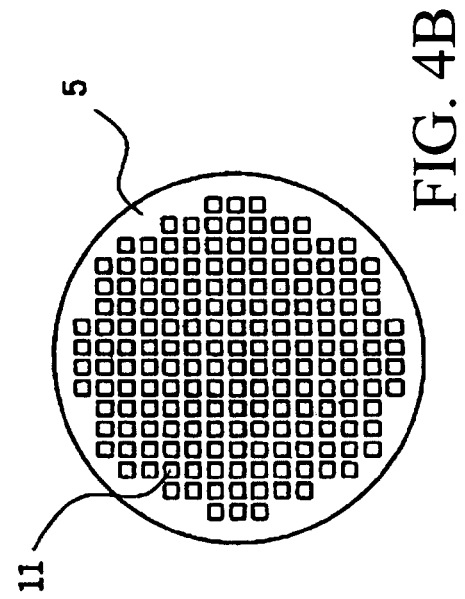
FIGS. 4A–4B illustrate a solder bump structure according to an embodiment detailed in U.S. patent application Ser. No. 10/339,456.
Figure 4A:
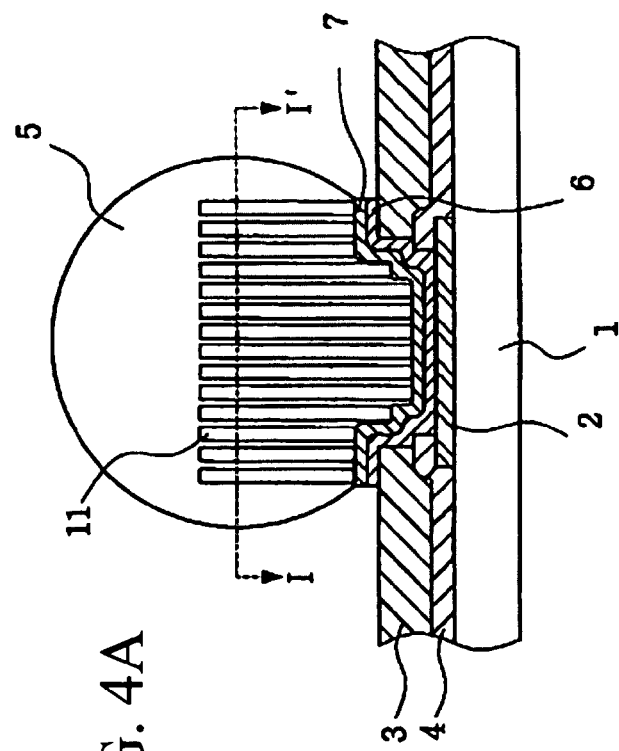

FIG. 4A is a cross-sectional view of a solder bump structure according to an embodiment of an invention disclosed in U.S. patent application Ser. No. 10/339,456, and FIG. 4B provides a cross-sectional view along the line I–I' of FIG. 4A. The solder bump structure includes a contact pad 2 of an electronic device such as a semiconductor chip 1 intended for use in a flip chip package or a wafer level package. An opening is defined in one or more passivation layers 3, 4 to expose a surface of the chip pad 2. Interposed between a solder bump 5 and the chip pad 2 may be one or more intermediate or barrier layers 6, 7. The intermediate layers 6, 7 may be under bump metallurgy (UBM) layers in which, for example, the lower layer 6 may be a UBM adhesion layer comprising Cr, Ni or TiW, and the upper layer 7 may be a wetting layer comprising Cu, Ni or NiV. The intermediate layers may also include an oxidation reduction layer of Au (not shown).

Depending on the intended application, the solder bump 5 may be manufactured in a variety of sizes, with a typically dimension being on the order of 100×100 $\mu$m, and from a variety of materials including combinations of one or more of Sn, Pb, Ni, Au, Ag, Cu, Bi and alloys thereof. In addition, at least one reinforcing projection or protrusion 11 extends upwardly from a surface of the intermediate layer 7 and is embedded within the solder bump 5. As illustrated in FIGS. 4A and 4B, a plurality of reinforcing protrusions 11 extend upwardly from the surface of the intermediate layer 7 and are embedded within the solder bump 5. Preferably, because of reflow of the solder material during fabrication, the melting/reflow temperature point of the solder composition in solder bump 5 will be less than the melting point of the reinforcing protrusions 11. As can the solder bump 5, the reinforcing protrusions may assume a variety of configurations and may, for example, have a width of between about 5 to 70 $\mu$m and may include one or more materials including Ni, Cu, Pd, Pt and alloys thereof.

Figure 3:
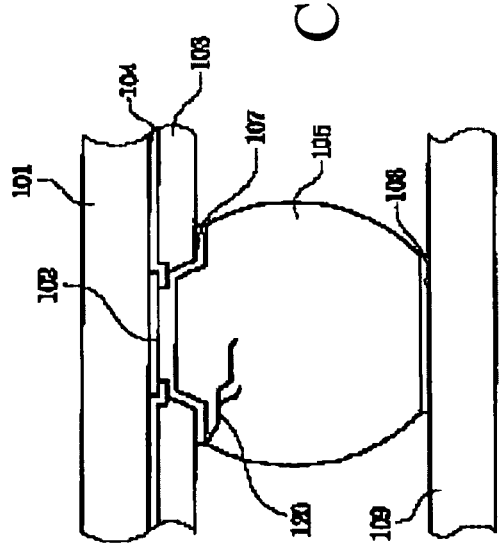
FIG. 3 illustrates a crack forming in a conventional flip-chip structure after mounting on a printed circuit board substrate and thermal cycling.

As illustrated in FIG. 4B, a cross-section of the plurality of protrusions 11 may be arranged in a regular pattern in a plane parallel to the contact pad 402. Generally, as illustrated in FIG. 3, a crack 120 forming in the solder bump connector 105 will tend to propagate horizontally through the bump material. Accordingly, a pattern of reinforcing protrusions 11 as illustrated in FIG. 4A will tend to suppress or impede crack propagation within the solder bump 5, thus increasing the crack resistance and lengthening the propagation path of any crack as it extends through the solder bump material, thus decreasing the likelihood device failure.

The reinforcing protrusions 11 may be arranged in a wide variety of patterns and configurations, both regular and irregular, including, for example, off-set parallel rows, radial projections or concentric sets of continuous or interrupted patterns. In addition, the cross-sections of the individual protrusions 11 may vary widely from the generally square cross-sections illustrated in FIG. 4B, to more rounded or elliptical cross-sections, polygonal cross-sections, and combinations thereof. Generally, however, configurations without sharp points or corners are preferred to further aid in suppressing crack formation and propagation. Moreover, a single contiguous protrusion may be arranged in the shape of a spiral or zig-zag pattern. Finally, although preferred, the invention need not be not limited to columnar protrusions as illustrated in FIG. 4A with having substantially vertical sidewalls and a substantially constant cross-sectional area along the majority of their length. For example, protrusions having oblique or notched sidewalls may be formed instead as may be protrusions arranged as regular or asymmetric geometric shapes may be provided.

First Exemplary Embodiment

Figure 5A:
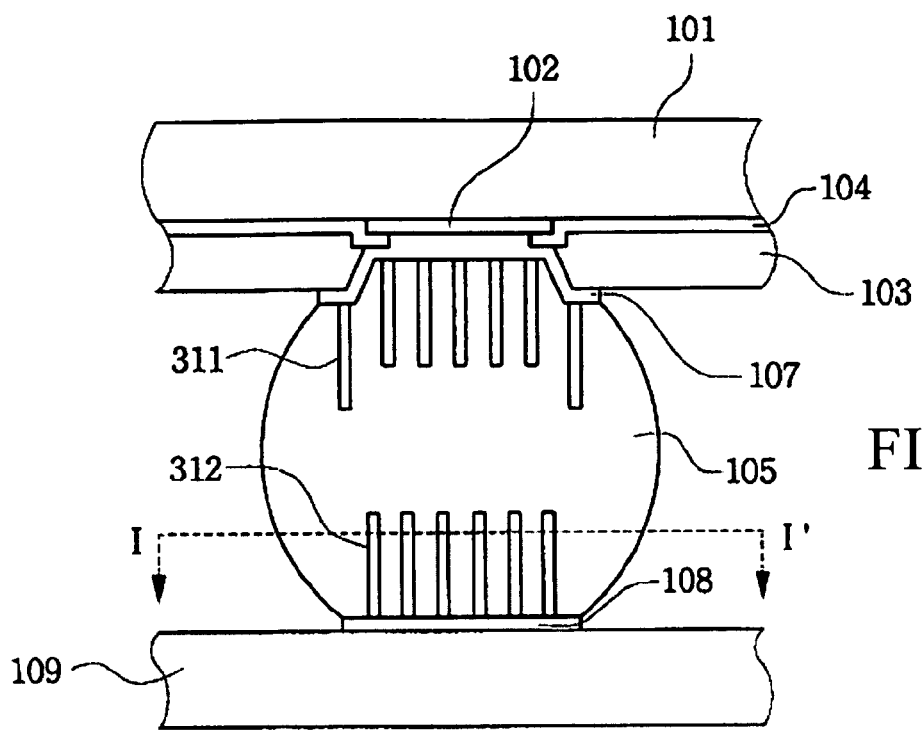
FIGS. 5A–5B illustrate a solder bump structure according to an exemplary embodiment of the present invention.
Figure 5B:
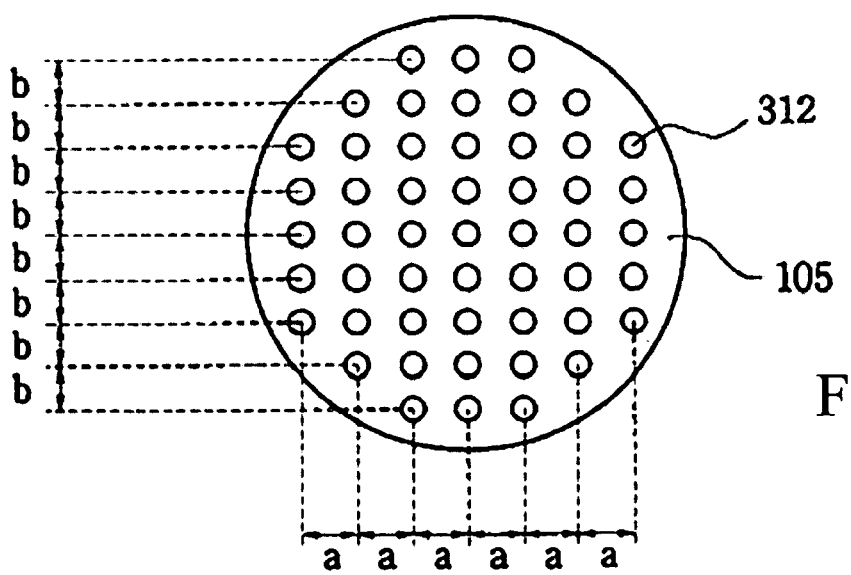

A first exemplary embodiment of a solder bump connector according to the present invention is illustrated in FIGS. 5A–B with FIG. 5A illustrating a vertical cross-section through an exemplary solder bump connector and FIG. 5B illustrating a horizontal cross-section through the reinforcing protrusions extending from the mounting substrate along a plane passing through line I–I'. The solder bump connector structure includes a contact pad 102 of an electronic device such as a semiconductor chip 101 intended for use in a flip chip package or a wafer level package. An opening is defined in one or more passivation layers 103, 104 to expose a surface of the chip pad 102. Interposed between the solder bump connector 105 and the chip pad 102 may be one or more intermediate or barrier layers 106, 107. The intermediate layers 106, 107 may be under bump metallurgy (UBM) layers in which, for example, the lower layer 106 may be a UBM adhesion layer comprising Cr, Ni or TiW, and the upper layer 107 may be a wetting layer comprising Cu, Ni or NiV. The intermediate layers may also include an oxidation reduction layer of Au (not shown).

Depending on the intended application, the solder bump connector 105 may be manufactured in a variety of sizes, with a typically dimension being on the order of 100×100 $\mu$m, and from a variety of materials including combinations of one or more of Sn, Pb, Ni, Au, Ag, Cu, Bi and alloys thereof. In addition, at least one, and preferably a plurality of, reinforcing projections or protrusions 311 extends upwardly from a surface of the intermediate layer 107 and is embedded within the solder bump connector 105. As illustrated in FIGS. 5A and 5B, a plurality of reinforcing protrusions 311 extend upwardly from the surface of the intermediate layer 107 and are embedded within the solder bump connector 105. Preferably, because of the need to reflow the solder material during fabrication, the melting/reflow temperature point of the solder composition in solder bump connector 105 will be less than the melting point of the reinforcing protrusions 311. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIGS. 5A–B the exemplary solder bump connector also includes a ball pad 108 of a mounting substrate such as a printed circuit board 109 or other substrate arranged and configured to receive and provide electrical connections to a semiconductor chip 101 mounted thereon in an application such as a flip chip package or a wafer level package. The ball pad 108, like the contact pad 102, may include one or more layers of conductive material to provide barrier, adhesion, wetting and/or oxidation suppression properties as desired. For example, the ball pad may include under bump metallurgy (UBM) layers such as a lower UBM adhesion layer (not shown) comprising Cr, Ni or TiW, and the upper layer (not shown) that may serve as a wetting layer comprising Cu, Ni or NiV and may include as a top layer an oxidation reduction layer of Au (not shown).

In addition to the materials used to form the ball pad 108, the mounting substrate will also include at least one, and preferably a plurality of, reinforcing projections or protrusions 312 extending upwardly from a surface of the ball pad 108 that is embedded within the solder bump connector 105. (As used herein, the term "upwardly" refers to those structures that extend from a substrate, regardless of their orientation as assembled) As illustrated in FIGS. 5A and 5B, a plurality of reinforcing protrusions 312 extend upwardly from the surface of the ball pad 108 and are embedded within the solder bump connector 105. Preferably, because of the need to reflow the solder material during fabrication, the melting/reflow temperature point of the solder composition in solder bump connector 105 will be less than the melting point of the reinforcing protrusions 312. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIG. 5B, a cross-section of the plurality of protrusions 312 may be arranged in a regular pattern in a plane parallel to the surfaces of both the contact pad 102 and the ball pad 108. Generally, as illustrated in FIG. 3, a crack 120 forming in the solder bump connector 105 will tend to propagate horizontally through the bump material. Accordingly, a pattern of reinforcing protrusions 311, 312 as illustrated in FIG. 5A will tend to suppress or impede crack propagation within the solder bump 105, thus increasing the crack resistance and lengthening the propagation path of any crack as it extends through the solder bump material, thus decreasing the likelihood device failure.

The reinforcing protrusions 311, 312 may be arranged in a wide variety of patterns and configurations, both regular and irregular, including, for example, off-set parallel rows, radial projections or concentric sets of continuous or interrupted patterns. In addition, the cross-sections of the individual protrusions 311, 312 may vary widely from the generally round cross-sections illustrated in FIG. 5B, to more square or polygonal cross-sections or line segments, and combinations thereof. Generally, however, configurations without sharp points or corners are preferred to further aid in suppressing crack formation and propagation. Moreover, single contiguous protrusions may be arranged in the shape of a spiral or zig-zag pattern. Finally, although preferred, the invention need not be not limited to columnar protrusions as illustrated in FIG. 5A with having substantially vertical sidewalls and a substantially constant cross-sectional area along the majority of their length. For example, protrusions having oblique or notched sidewalls may be formed instead as may be protrusions arranged as regular or asymmetric geometric shapes may be provided.

Second Exemplary Embodiment

A second exemplary embodiment of a solder bump connector according to the present invention is illustrated in FIGS. 6A–D with FIG. 6A illustrating a vertical cross-section through an exemplary solder bump connector and FIGS. 6B–D illustrating a horizontal cross-sections through various configurations of the reinforcing protrusions extending from the mounting substrate along a plane passing through line II–II'. As illustrated and described with regard to FIG. 5A, the solder bump connector structure of FIG. 6A includes a contact pad 102 of an electronic device such as a semiconductor chip 101 intended for use in a flip chip package or a wafer level package. An opening is defined in one or more passivation layers 103, 104 to expose a surface of the chip pad 102. Interposed between the solder bump connector 105 and the chip pad 102 may be one or more intermediate or barrier layers 106, 107. The intermediate layers 106, 107 may be under bump metallurgy (UBM) layers in which, for example, the lower layer 106 may be a UBM adhesion layer comprising Cr, Ni or TiW, and the upper layer 107 may be a wetting layer comprising Cu, Ni or NiV. The intermediate layers may also include an oxidation reduction layer of Au (not shown).

In addition, at least one, and preferably a plurality of, reinforcing projections or protrusions 311 extends upwardly from a surface of the intermediate layer 107 and is embedded within the solder bump connector 105. As illustrated in FIG. 6A, a plurality of reinforcing protrusions 311 extend upwardly from the surface of the intermediate layer 107 and are embedded within the solder bump connector 105. Preferably, because of the need to reflow the solder material during fabrication, the melting/reflow temperature point of the solder composition in solder bump connector 105 will be less than the melting point of the reinforcing protrusions 311. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIG. 6A, the exemplary solder bump connector also includes a ball pad 108 of a mounting substrate such as a printed circuit board 109 or other substrate arranged and configured to receive and provide electrical connections to a semiconductor chip 101 mounted thereon in an application such as a flip chip package or a wafer level package. The ball pad 108, like the contact pad 102, may include one or more layers of conductive material to provide barrier, adhesion, wetting and/or oxidation suppression properties as desired. For example, the ball pad may include under bump metallurgy (UBM) layers such as a lower UBM adhesion layer (not shown) comprising Cr, Ni or TiW, and the upper layer (not shown) that may serve as a wetting layer comprising Cu, Ni or NiV and may include as a top layer an oxidation reduction layer of Au (not shown).

In addition to the materials used to form the ball pad 108, the mounting substrate will also include at least one, and preferably a plurality of, reinforcing projections or protrusions 312 extending upwardly from a surface of the ball pad 108 that is embedded within the solder bump connector 105. As illustrated in FIG. 6A, a plurality of reinforcing protrusions 312 extend upwardly from the surface of the ball pad 108 and are embedded within the solder bump connector 105. Preferably, because of the need to reflow the solder material during fabrication, the melting/reflow temperature point of the solder composition in solder bump connector 105 will be less than the melting point of the reinforcing protrusions 312. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIG. 6A, however, the lengths or heights of at least some of the protrusions 311, 312 are, in combination, greater than the spacing between the intermediate layer 107 and the ball pad 108, causing the upper portions of at least some of the protrusions to overlap. As illustrated in FIGS. 6B–D, the protrusions 311, 312 may be arranged in a complementary patterns or arrays that combine to form patterns having protrusion-to-protrusion spacings a, b, c, d in the form of rows, alternating rows, offset rows of a combination thereof.

As illustrated in FIGS. 6B–D, a cross-section of the plurality of protrusions 311, 312 may be arranged in a regular pattern in a plane parallel to the surfaces of both the contact pad 102 and the ball pad 108. Generally, as illustrated in FIG. 3, a crack 120 forming in the solder bump connector 105 will tend to propagate horizontally through the bump material. Accordingly, a pattern of reinforcing protrusions 311, 312 as illustrated in FIGS. 6A–D will tend to suppress or impede crack propagation within the solder bump 105, thus increasing the crack resistance and lengthening the propagation path of any crack as it extends through the solder bump material, thus decreasing the likelihood device failure.

The reinforcing protrusions 311, 312 may be arranged in a wide variety of patterns and configurations, both regular and irregular, including, for example, off-set parallel rows, radial projections or concentric sets of continuous or interrupted patterns. In addition, the cross-sections of the individual protrusions 311, 312 may vary widely from the generally round cross-sections illustrated in FIGS. 6B–D, to more square or polygonal cross-sections or line segments, and combinations thereof. Generally, however, configurations without sharp points or corners are preferred to further aid in suppressing crack formation and propagation. Moreover, single contiguous protrusions may be arranged in the shape of a spiral or zig-zag pattern. Finally, although preferred, the invention need not be not limited to columnar protrusions as illustrated in FIG. 6A with having substantially vertical sidewalls and a substantially constant cross-sectional area along the majority of their length. For example, protrusions having oblique or notched sidewalls may be formed instead as may be protrusions arranged as regular or asymmetric geometric shapes may be provided.

Third Exemplary Embodiment

A third exemplary embodiment of a solder bump connector according to the present invention is illustrated in FIGS. 7A–C with FIG. 7A illustrating a vertical cross-section through an exemplary solder bump connector, FIG. 7B providing an orthogonal view of the separated semiconductor chip 101 and mounting substrate 109, and FIG. 7C illustrating a horizontal cross-sections through the configuration of the reinforcing protrusions extending from the mounting substrate along a plane passing through line II–II' of FIG. 7A. As illustrated and described with regard to FIG. 6A, the solder bump connector structure of FIG. 7A includes a contact pad 102 of an electronic device such as a semiconductor chip 101 intended for use in a flip chip package or a wafer level package. An opening is defined in one or more passivation layers 103, 104 to expose a surface of the chip pad 102. Interposed between the solder bump connector 105 and the chip pad 102 may be one or more intermediate or barrier layers 106, 107. The intermediate layers 106, 107 may be under bump metallurgy (UBM) layers in which, for example, the lower layer 106 may be a UBM adhesion layer comprising Cr, Ni or TiW, and the upper layer 107 may be a wetting layer comprising Cu, Ni or NiV. The intermediate layers may also include an oxidation reduction layer of Au (not shown).

In addition, at least one reinforcing projection or protrusion 411 extends upwardly from a surface of the intermediate layer 107 and is embedded within the solder bump connector 105. As illustrated in FIG. 7A, a single cylindrical reinforcing protrusions 411 extends upwardly from the surface of the intermediate layer 107 and is embedded within the solder bump connector 105. Preferably, because of the need to reflow the solder material during fabrication, the melting/reflow temperature point of the solder composition in solder bump connector 105 will be less than the melting point of the reinforcing protrusion 411. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIG. 7A, the exemplary solder bump connector also includes a ball pad 108 of a mounting substrate such as a printed circuit board 109 or other substrate arranged and configured to receive and provide electrical connections to a semiconductor chip 101 mounted thereon in an application such as a flip chip package or a wafer level package. The ball pad 108, like the contact pad 102, may include one or more layers of conductive material to provide barrier, adhesion, wetting and/or oxidation suppression properties as desired. For example, the ball pad may include under bump metallurgy (UBM) layers such as a lower UBM adhesion layer (not shown) comprising Cr, Ni or TiW, and the upper layer (not shown) that may serve as a wetting layer comprising Cu, Ni or NiV and may include as a top layer an oxidation reduction layer of Au (not shown).

In addition to the materials used to form the ball pad 108, the mounting substrate also includes a reinforcing projections or protrusions 412 extending upwardly from a surface of the ball pad 108 that is embedded within the solder bump connector 105. Preferably, because of the need to reflow the solder material during fabrication, the melting/reflow temperature point of the solder composition in solder bump connector 105 will be less than the melting point of the reinforcing protrusion 412. As can the solder bump connector 105, the reinforcing protrusions may assume a variety of configurations and may, for example, have a width of between about 5 to 70 $\mu$m and may include one or more materials including Ni, Cu, Pd, Pt and alloys thereof.

As illustrated in FIG. 7A, however, the lengths or heights of the protrusions 411, 412 are, in combination, greater than the spacing between the intermediate layer 107 and the ball pad 108, causing the upper portions of the protrusions to overlap. As illustrated in FIG. 7C, the protrusions 411 (solid), 412 (outline) may be arranged in complementary configurations whereby one protrusion, in this instance, 411, surrounds or substantially surrounds (not shown) the other protrusion, in this instance, 412.

As illustrated in FIGS. 8A–E, the protrusions 411 (solid), 412 (outline) may assume a wide variety of configurations while achieving this surrounding orientation. As illustrated in FIG. 8A, the protrusion 411, rather than being cylindrical, may comprise a plurality of protrusions 411$a$ arranged in a generally circular configuration around protrusion 412$a$. As illustrated in FIG. 8B, the protrusion 412, rather than being cylindrical, may comprise a plurality of protrusions 412$b$ arranged across in a generally field surrounded by around protrusion 411$b$. As illustrated in FIG. 8C, the protrusion 411, rather than being cylindrical, may be formed as a hollow square 411$c$ or another open polygon (not illustrated) surrounding protrusion 412$c$. As illustrated in FIG. 8D, the protrusion 411, rather than being cylindrical, may comprise a plurality of protrusions 411$d$ arranged around a plurality of protrusions 412$d$ arranged across a generally circular field. And, as illustrated in FIG. 8E, the protrusion 412, rather than being cylindrical, may comprise a square 412$e$ or other polygonal shape (not shown) surrounded by a generally cylindrical protrusion 411$e$.

Fourth Exemplary Embodiment

Figure 9A:
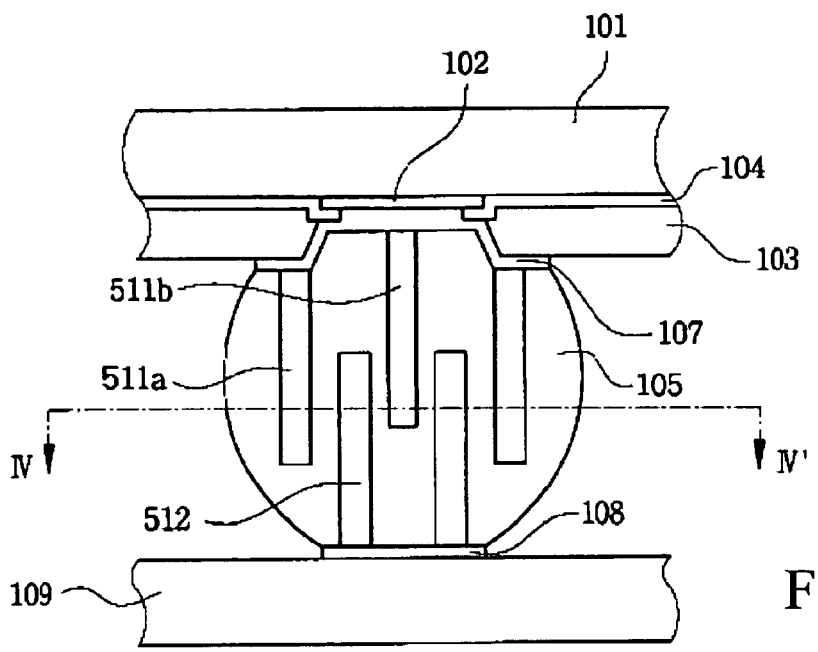
FIGS. 9A–9B illustrate a solder bump structure according to another exemplary embodiment of the present invention.
Figure 9B:
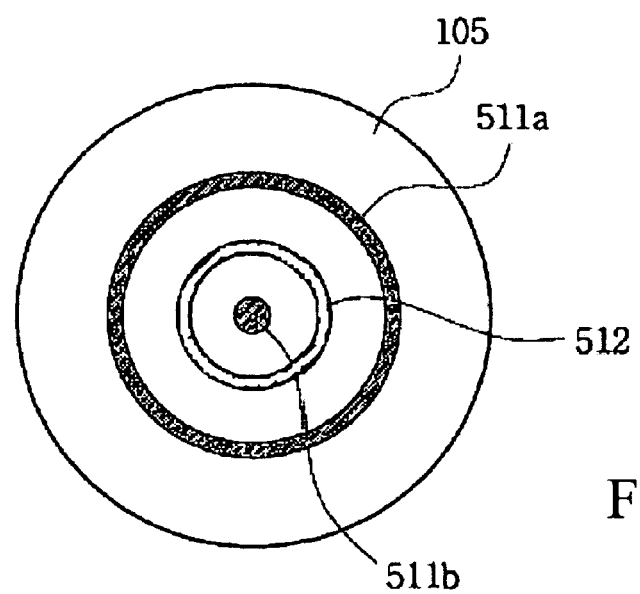

A fourth exemplary embodiment of a solder bump connector according to the present invention is illustrated in FIGS. 9A14 B with FIG. 9A illustrating a vertical cross-section through an exemplary solder bump connector and FIG. 9B illustrating a horizontal cross-sections through the configuration of the reinforcing protrusions extending from the mounting substrate along a plane passing through line IV–IV' of FIG. 9A. As illustrated and described with regard to FIG. 7A, the solder bump connector structure of FIG. 9A includes a contact pad 102 of an electronic device such as a semiconductor chip 101 intended for use in a flip chip package or a wafer level package. An opening is defined in one or more passivation layers 103, 104 to expose a surface of the chip pad 102. Interposed between the solder bump connector 105 and the chip pad 102 may be one or more intermediate or barrier layers 106, 107. The intermediate layers 106, 107 may be under bump metallurgy (UBM) layers in which, for example, the lower layer 106 may be a UBM adhesion layer comprising Cr, Ni or TiW, and the upper layer 107 may be a wetting layer comprising Cu, Ni or NiV. The intermediate layers may also include an oxidation reduction layer of Au (not shown).

In addition, at least two reinforcing projections or protrusions 511$a$ extend upwardly from a surface of the intermediate layer 107 and is embedded within the solder bump connector 105. As illustrated in FIG. 9A, a cylindrical reinforcing protrusion 511$a$ extends upwardly from the surface of the intermediate layer 107, surrounds an internal reinforcing protrusion 511$b$, and is embedded within the solder bump connector 105. Preferably, because of the need to reflow the solder material during fabrication, the melting/reflow temperature point of the solder composition in solder bump connector 105 will be less than the melting point of the reinforcing protrusions 511a, 511b. As can the solder bump connector 105, the reinforcing protrusions may assume a variety of configurations and may, for example, have a width of between about 5 to 70 μm and may include one or more materials including Ni, Cu, Pd, Pt and alloys thereof.

As illustrated in FIG. 9A, the exemplary solder bump connector also includes a ball pad 108 of a mounting substrate such as a printed circuit board 109 or other substrate arranged and configured to receive and provide electrical connections to a semiconductor chip 101 mounted thereon in an application such as a flip chip package or a wafer level package. The ball pad 108, like the contact pad 102, may include one or more layers of conductive material to provide barrier, adhesion, wetting and/or oxidation suppression properties as desired. For example, the ball pad may include under bump metallurgy (UBM) layers such as a lower UBM adhesion layer (not shown) comprising Cr, Ni or TiW, and the upper layer (not shown) that may serve as a wetting layer comprising Cu, Ni or NiV and may include as a top layer an oxidation reduction layer of Au (not shown).

In addition to the materials used to form the ball pad 108, the mounting substrate also includes at least one reinforcing projection or protrusion 512 extending upwardly from a surface of the ball pad 108 that is embedded within the solder bump connector 105. Preferably, because of the need to reflow the solder material during fabrication, the melting/reflow temperature point of the solder composition in solder bump connector 105 will be less than the melting point of the reinforcing protrusion 512. As can the solder bump connector 105, the reinforcing protrusions may assume a variety of configurations and may, for example, have a width of between about 5 to 70 μm and may include one or more materials including Ni, Cu, Pd, Pt and alloys thereof.

As illustrated in FIG. 9A, however, the lengths or heights of the protrusions 511a, 511b, 512 are, in combination, greater than the spacing between the intermediate layer 107 and the ball pad 108, causing the upper portions of the protrusions to overlap. As illustrated in FIG. 9B, the protrusions 511a, 511b, and 512 may be arranged in complementary configurations whereby one protrusion, in this instance, 511, is both surrounded by, 511b, and substantially surrounds, 511a, the other protrusion, in this instance, 512.

Exemplary Method of Forming Reinforced Solder Bump

Figure 10A:
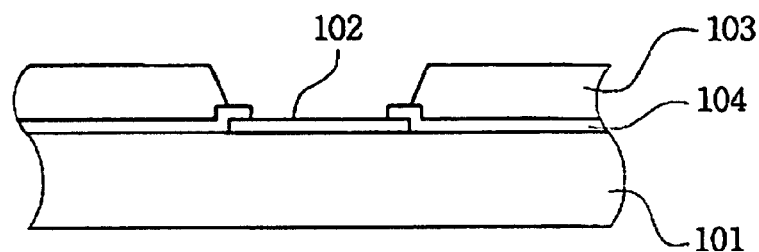
FIGS. 10A–10J are cross-sectional views illustrating an exemplary embodiment of a manufacturing process for producing a solder bump structure according to an exemplary embodiment of the present invention.
Figure 10B:
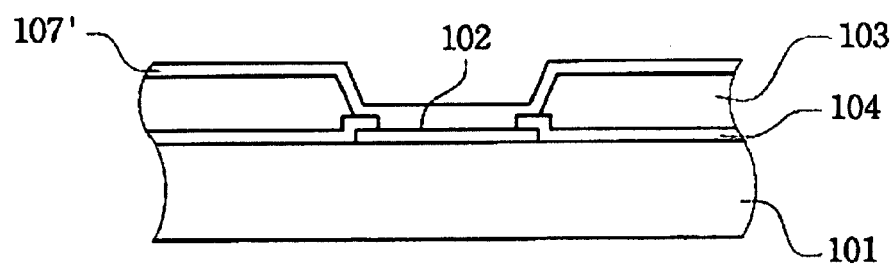

An exemplary method for manufacturing a solder bump structure according to the exemplary embodiments of the invention will now be described with reference to FIGS. 10A–J. As illustrated in FIG. 10A, an opening is defined in one or more passivation layers 103 and 104 which exposes a surface of a chip pad or contact pad 102 formed on a semiconductor chip 101, the chip pad typically being made of aluminum. As illustrated in FIG. 10B, at least one intermediate layer 107' is the formed over the passivation layers 103 and 104 and over the exposed surface of the chip pad 102. The intermediate layer 107' may be constructed using sputtering to form under bump metallurgy (UBM) layers including adhesion layers of Cr, Ni or TiW, and/or a wetting layer made of Cu, Ni or NiV and may include an additional oxidation suppression layer of Au.

Figure 10C:
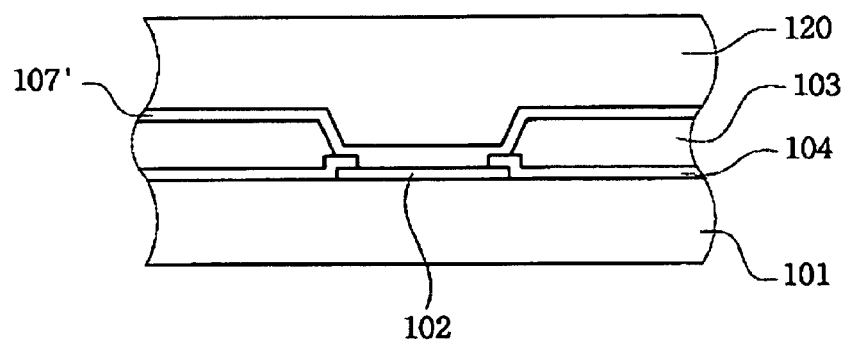
Figure 10D:
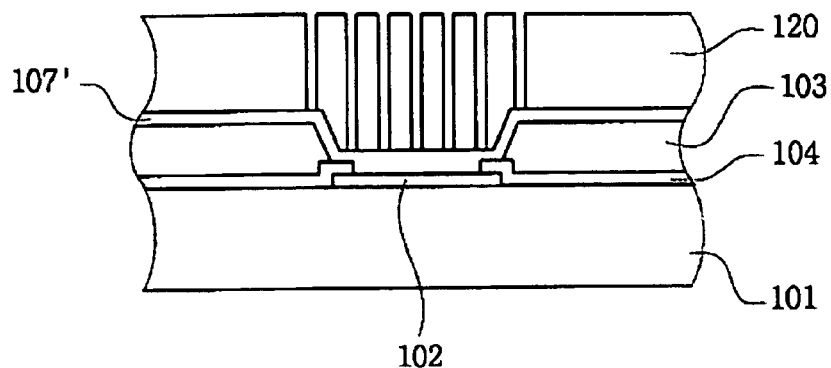
Figure 10E:
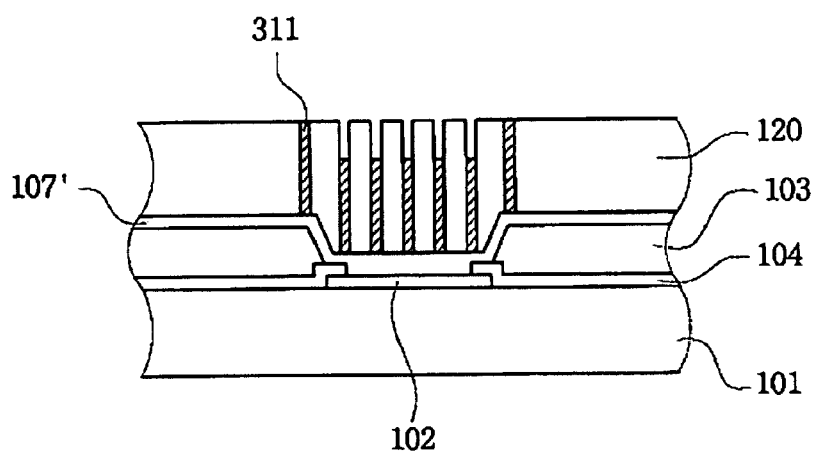

As illustrated in FIG. 10C, a photoresist layer 120 is formed on the intermediate layer 107'. The photoresist layer 120 is then exposed and developed to form one or more openings that expose one or more surface portions of the intermediate layer 107'. The openings may be arranged and configured for the formation of any of the exemplary protrusion configurations described or illustrated above as well as other desired configurations. As illustrated in FIG. 10D, a first thickness of protrusion material, preferably a conductive material such as Ni, Cu, Pd, Pt, Au or alloys thereof, may be deposited in the openings by electroplating or other suitable technique. Nickel and its alloys are preferred to avoid the thicker intermetallic compound (IMC) layer associated with Cu, the more limited wetability and expense of Pd and Pt, and the higher solubility and expense of Au.

Figure 10F:
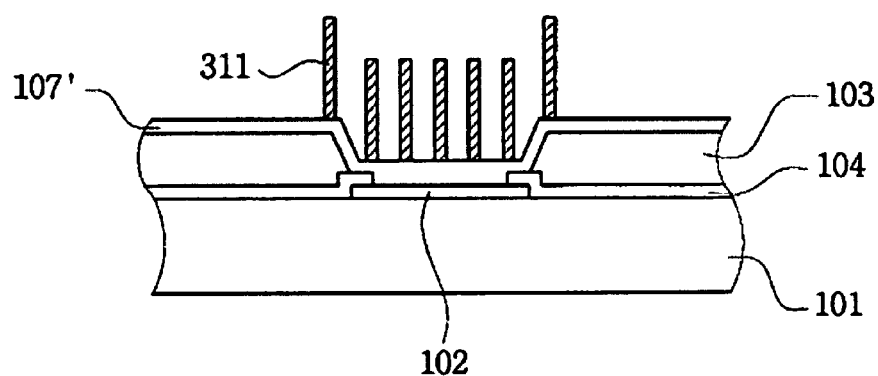
Figure 10G:
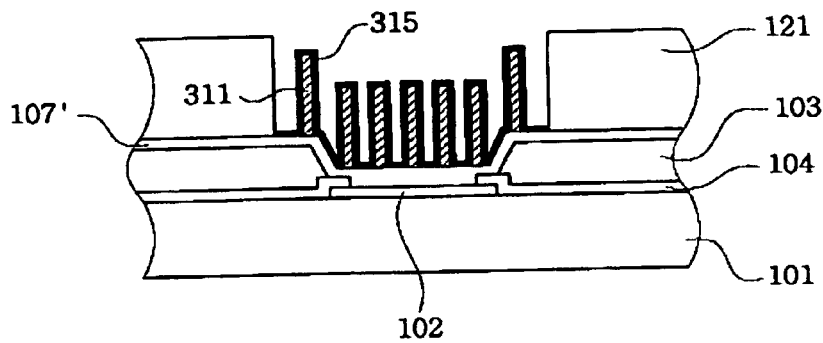
Figure 10H:
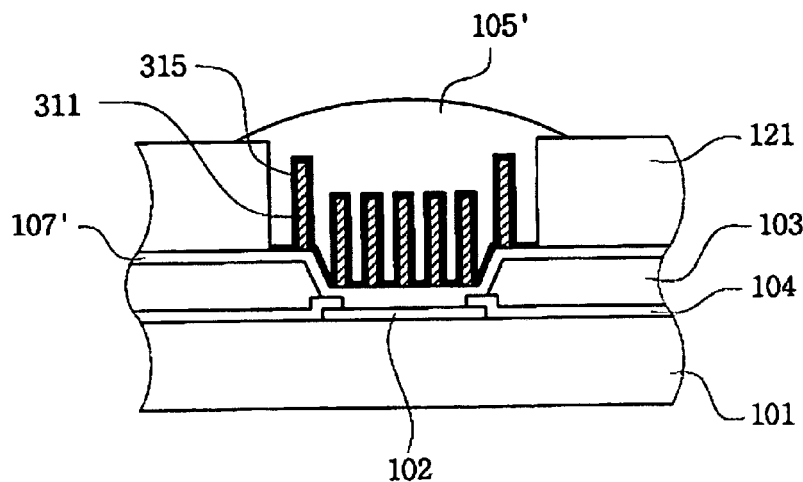

As illustrated in FIG. 10F, the photoresist 120 is then removed, leaving behind the protrusions 311. The protrusions will typically have similar heights, but the configuration of the intermediate layer 107' and underlying structures may result in some of the protrusions 311, particularly those more centrally located on the contact pad 102, appearing "recessed" relative to other of the protrusions. As illustrated in FIG. 10G, a second photoresist pattern 121 is then formed to expose the protrusions 311 and adjacent surface portions of the intermediate layer 107'. An optional cover metal layer 315 may then be deposited on the protrusions 311 and the exposed surface portions of the intermediate layer 107'. If used, the cover metal layer may be formed from a metal such as Ni, Cu or Au and their alloys, by electroplating, sputtering or other suitable deposition technique. As illustrated in FIG. 10H, a solder composition 105', typically applied as a paste, is then deposited to fill the opening and surround the protrusions 311.

Figure 10I:
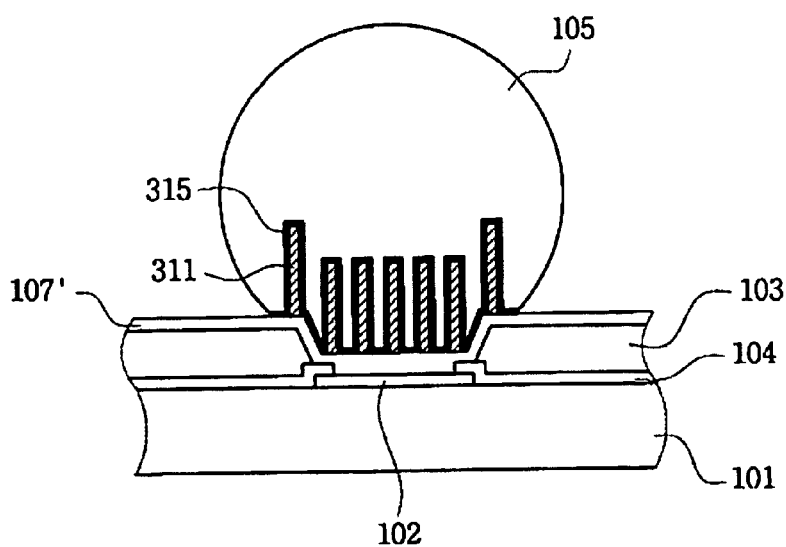
Figure 10J:
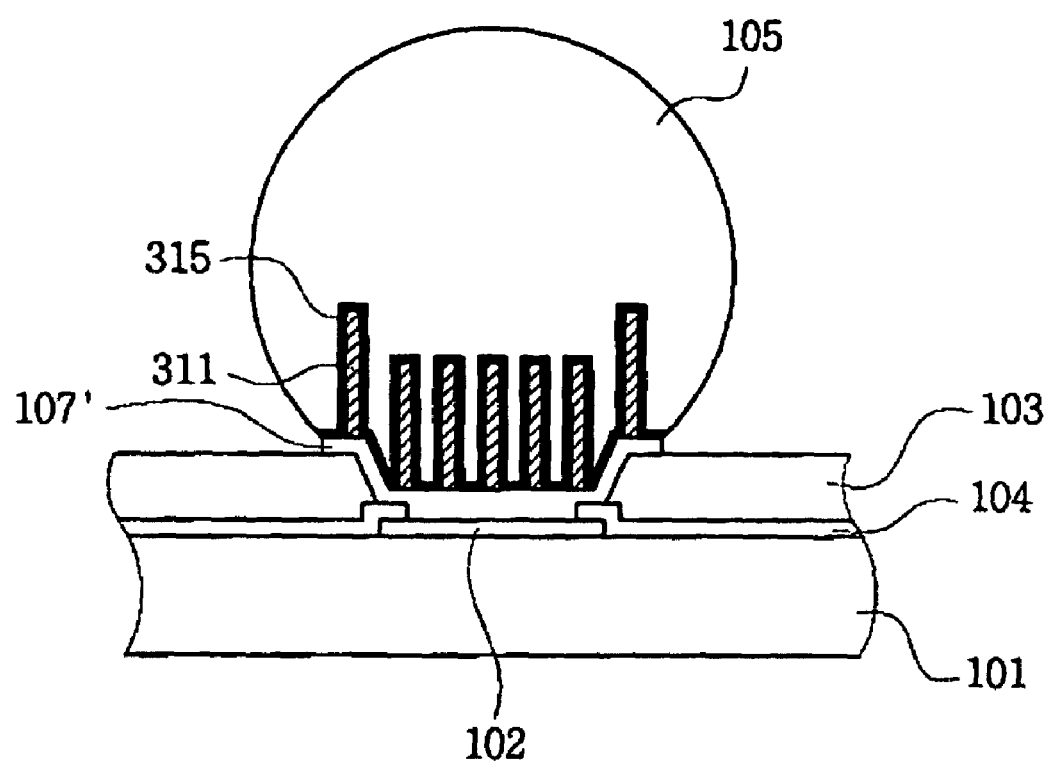

As illustrated in FIG. 10I, the second photoresist pattern 121 may then be removed and the solder composition 105' heated to a temperature sufficient to cause the solder composition to flow but sufficiently low as to maintain the structural integrity of the protrusions 311. The surface tension of the molten solder composition 105' will tend to cause the solder to assume at least a partially spherical orientation, after which it is cooled to form solder ball 105 in which the protrusions 311 are embedded. As illustrated in FIG. 10J, the portion of the intermediate layer 107' not protected by the solder ball 105 may then be removed from the surface of passivation layer 103 using a selective etch. Portions of the intermediate layer 107' may also be removed prior to formation of the solder ball 105 by removing those portions not protected by the solder composition 105', thereby avoiding the need to expose the surface of the completed solder ball 105 to the etch chemistry.

Figure 11A:
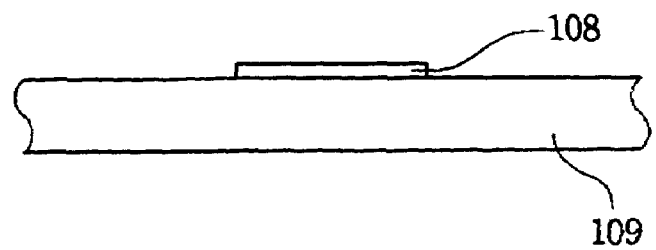
FIGS. 11A–11E are cross-sectional views illustrating an exemplary embodiment of a manufacturing process for producing a solder bump structure according to an exemplary embodiment of the present invention.

The manufacture of the corresponding portions of the mounting substrate 109 are illustrated in FIGS. 11A–E. As illustrated in FIG. 11a, a mounting substrate 109 such as a printed circuit board (PCB) is provided with a ball pad 108. The ball pad 108 may be made from a single material, such as Al or an aluminum alloy, but may also be constructed with a multi-layer construction including sequential layers of Cu, Ni, and/or Au (not shown). In such an instance, a portion of the copper ball pad 108 can be exposed using a photoresist pattern with the Ni and the Au layers then being applied sequentially by electroless plating or other suitable metallization technique.

Figure 11B:
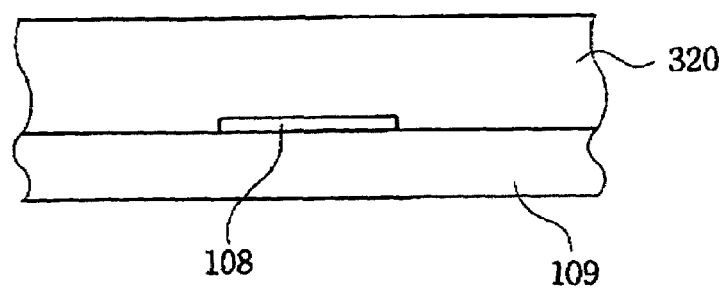
Figure 11C:
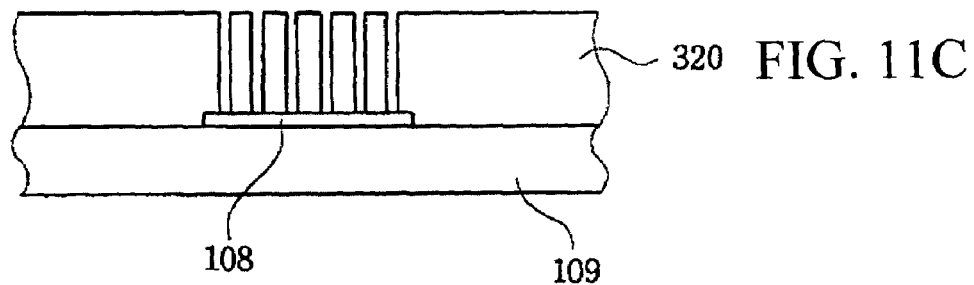

As illustrated in FIG. 11B, a third photoresist layer 320 is then formed on the mounting substrate 109 and the ball pad 108. As illustrated in FIG. 11C, the photoresist layer 320 is then patterned using a conventional photolithography technique or another technique such as laser drilling to form openings in the photoresist layer that expose portions of the surface of the ball pad 108. The choice of the conventional photolithographic techniques or another "patterning" technique will typically depend on the resolution required for the pattern and the desired throughput of the patterning operation. For example, while a conventional photolithographic technique may be able to produce suitable patterns for some applications, laser drilling may provide nearly double the resolution and improve the patterning performance in more challenging applications.

Figure 11D:
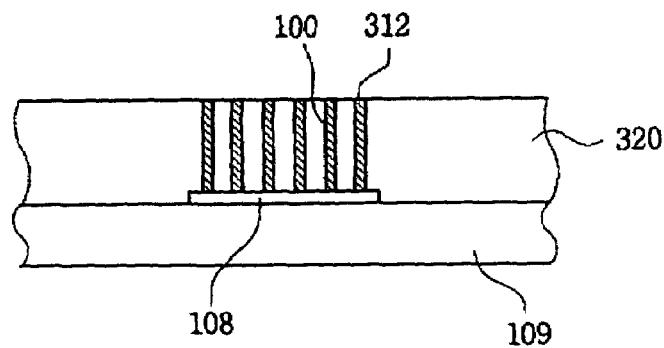
Figure 11E:
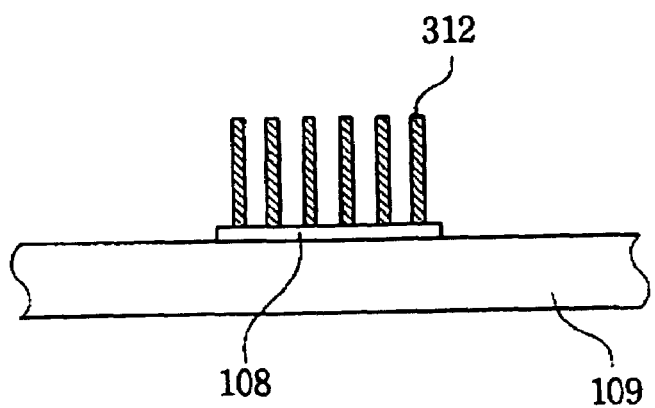

As illustrated in FIG. 11D, a first thickness of protrusion material, preferably a conductive material such as Ni, Cu, Pd, Pt, Au or alloys thereof, may be deposited in the openings by electroplating or other suitable technique. Nickel and its alloys are preferred to avoid the thicker intermetallic compound (IMC) layer associated with Cu, the more limited wetability and expense of Pd and Pt, and the higher solubility and expense of Au. As illustrated in FIG. 11E, the photoresist pattern 320 is then removed, leaving behind the protrusions 312. As with the protrusions described in connection with FIG. 10G, a second photoresist pattern (not shown) may then formed to expose the protrusions 312 and adjacent surface portions of the ball pad 108. An optional cover metal layer (not shown) may then be deposited on the protrusions 312 and the exposed surface portions of the ball pad 108. If used, the cover metal layer may be formed from a metal such as Ni, Cu or Au and their alloys, by electroplating, sputtering or other suitable deposition technique.

Exemplary Assembly Method

Figure 12A:
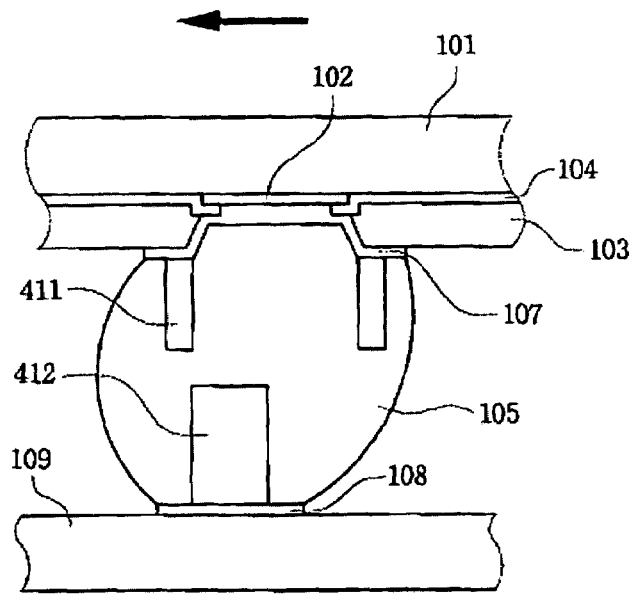
FIGS. 12A–12B are cross-sectional views illustrating an exemplary mounting/reflow process for producing a semiconductor device utilizing an exemplary embodiment of the present invention.
Figure 12B:
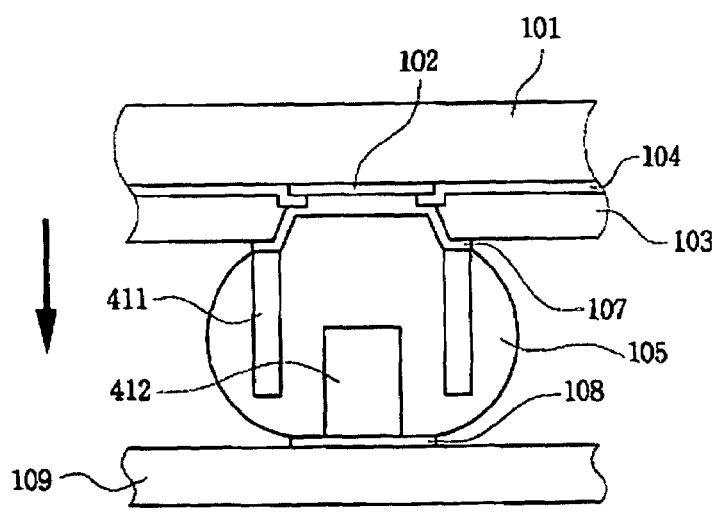

As illustrated in FIG. 12A, a semiconductor chip 101 and a mounting substrate 109 are brought into close proximity with an initial separation distance and the solder ball 105 is heated to a temperature sufficient to cause it to reflow and extend from protrusion 411 to encompass corresponding protrusion 412 on the mounting substrate. To the extent that there is some initial misalignment, the action of the molten solder ball 105 will tend to self-align the semiconductor chip 101 and the mounting substrate 109 by tending to shift the semiconductor chip in the direction of the horizontal arrow. Once the semiconductor chip 101 and the mounting substrate 109 have been given an opportunity to self-align, the spacing between the semiconductor chip and the mounting substrate may be reduced to establish a final spacing and the solder ball 105 allowed to cool to complete the solder connection as illustrated in FIG. 12B.

Additional Protrusion Configurations

Figure 13A:
FIG. 13A–13E are plan views illustrating various protrusion configurations.
Figure 13B:
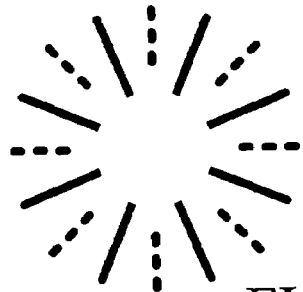
Figure 13C:
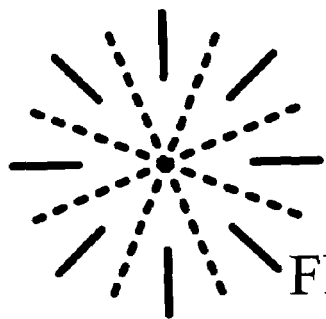
Figure 13D:
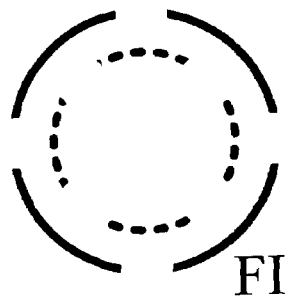
Figure 13E:
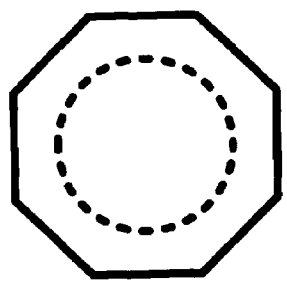
Figure 13F:
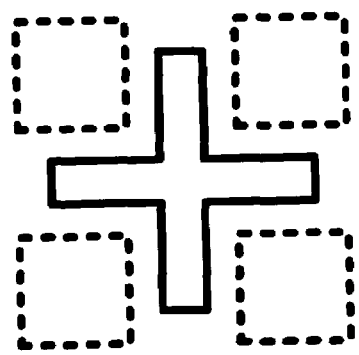

As illustrated in FIGS. 13A–F, the combination of the overlap region between a first protrusion or group of protrusions from a first surface (solid) and a second protrusion or group of protrusions from a second surface (dashed). As illustrated in FIGS. 13A and 13E, the protrusions may comprise a continuous outer structure enclosing a continuous inner structure which may also be an open structure or a solid structure (not shown). As illustrated in FIG. 13D, similar protrusion structures may be arranged as a plurality of interrupted segments. As illustrated in FIGS. 13B and 13C, the protrusions may be configured as a plurality of alternating line segments arranged radially from a longitudinal axis. As illustrated in FIGS. 13A and 13F, the protrusions can be configured as shapes in which one or both of the protrusions have both concave and convex surfaces. As reflected in the various configurations illustrated and discussed above, the protrusion configurations may comprise a wide range of structures. The particular configurations selected, however, should be one that is well within the patterning tolerance of the photolithographic process being utilized in the process.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A solder bump structure providing electrical and mechanical connection between a semiconductor chip and a mounting substrate, comprising:
    a contact pad arranged on the semiconductor chip;
    a first protrusion extending upwardly from the contact pad;
    a ball pad arranged on the mounting substrate;
    a second protrusion extending upwardly from the ball pad;
    a volume of solder material embedding the first and second protrusions.

2. A solder bump structure according to claim 1, further comprising:
    an intermediate layer formed on the contact pad;
    a plurality of first protrusions; and
    a plurality of second protrusions, wherein the volume of solder material is sufficient to embed substantially all of the first and second protrusions.

3. A solder bump structure according to claim 2, wherein:
    a portion of a first protrusion overlaps a portion of a second protrusion.

4. A solder bump structure according to claim 2, wherein:
    a portion of each of the first protrusions overlaps a portion of each of the second protrusions.

5. A solder bump structure according to claim 2, wherein:
    a portion of the plurality of the first protrusions are arranged to form a periphery around a portion each of the second protrusions.

6. A solder bump structure according to claim 1, wherein:
    a portion of a first protrusion surrounds a portion of a second protrusion.

7. A solder bump structure according to claim 1, wherein:
    a portion of a first protrusion surrounds a portion of a second protrusion;
    a portion of the second protrusion surrounds a portion of another first protrusion.

8. A semiconductor device including a semiconductor chip and a mounting substrate interconnected by a solder connection having a central longitudinal axis that is substantially normal to main surfaces of both the semiconductor chip and the mounting substrate, the solder connection comprising:
    solder;
    a first reinforcing structure, the first reinforcing structure extending into the solder from the semiconductor chip and substantially contained within the solder; and
    a second reinforcing structure the second reinforcing structure extending into the solder from the mounting substrate and substantially contained within the solder,
    wherein the first and second reinforcing structures are arranged substantially symmetrically about the longitudinal axis of the solder connection.

9. A semiconductor device according to claim 8, wherein:
    the solder connection has a height $T_s$;
    the first reinforcing structure has a height $T_{r1}$;
    the second reinforcing structure has a height $T_{r2}$; and wherein
    the ratio $(T_{r1}+T_{r2}): T_s$ is between about 1:10 and 1:1.

10. A semiconductor device according to claim 8, wherein:
    the solder connection has a height $T_s$;
    the first reinforcing structure has a height $T_{r1}$;

the second reinforcing structure has a height $T_{r2}$; and wherein the relationship $T_{r1}+T_{r2} \geq T_s$ is satisfied.

11. A semiconductor device according to claim 10, wherein:

the relationship $T_{R1}+T_{R2}>T_S$ is satisfied; and a lower portion of the first reinforcing structure surrounds an upper portion of the second reinforcing structure.

12. A semiconductor device according to claim 10, wherein:

the relationship $T_{R1}+T_{R2}>T_S$ is satisfied;

a lower portion of an outer portion of the first reinforcing structure surrounds an upper portion of the second reinforcing structure; and the upper portion of the second reinforcing structure surrounds a lower portion of an inner portion of the first reinforcing structure.

13. A semiconductor device according to claim 10, wherein:

the first reinforcing structure has a substantially uniform cross-section area along the majority of height $T_{R1}$.

14. A semiconductor device according to claim 10, wherein:

the second reinforcing structure has a substantially uniform cross-section area along the majority of height $T_{R2}$.

15. A semiconductor device according to claim 10, wherein:

the cross-section area of the first reinforcing structure and the cross-section area of the second reinforcing structure are substantially equal.

16. A semiconductor device according to claim 10, wherein:

the first structure and the second reinforcing structure are formed from conductive material.

17. A semiconductor device according to claim 16, wherein:

the first structure includes a first conductive material, the first conductive material being encompassed by a cover metal layer.

18. A semiconductor device according to claim 17, wherein:

the first structure and the second reinforcing structure include a conductive material selected from a group consisting of Ni, Cu, Pd, Pt and Au; and the cover metal layer includes a conductive material selected from a group consisting of Ni, Cu and Au.

* * * * *